United States Patent
Higuchi

(10) Patent No.: US 7,552,411 B2
(45) Date of Patent: Jun. 23, 2009

(54) LSI ANALYSIS METHOD, LSI ANALYSIS APPARATUS, AND COMPUTER PRODUCT

(75) Inventor: Hiroyuki Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 11/655,189

(22) Filed: Jan. 19, 2007

(65) Prior Publication Data

US 2007/0283302 A1    Dec. 6, 2007

(30) Foreign Application Priority Data

May 31, 2006    (JP)    ............... 2006-152317

(51) Int. Cl.
  G06F 17/50    (2006.01)
  G06F 9/45    (2006.01)
(52) U.S. Cl. .............................. 716/5; 716/4
(58) Field of Classification Search .............. 716/4, 716/5
  See application file for complete search history.

(56) References Cited

U.S. PATENT DOCUMENTS 7,363,605 B1 *  4/2008  Kondratyev et al. ............ 716/6

OTHER PUBLICATIONS

Gregory Steele et al, "Full Chip Verification Methods for DSM Power Distribution Systems" 35th Design Automation Conference, Jun. 1998.

Harish Kriplani et al., "Pattern Independent Maximum Current Estimation in Power and Ground Buses of CMOS VLSI Circuits: Algorithms, Signal Correlation, and Their Resolution" IEEE Transactions of Computer-Aided Design of Integrated Circuits and Systems vol. 14 No. 8, Aug. 1995, (pp. 998-1012).

Angela Krstic et al., "Vector Generation for Maximum Instantaneous Current Through Supply Lines for CMOS Circuits" Design Automation Conference, 1997.

* cited by examiner

*Primary Examiner*—Stacy A Whitmore
*Assistant Examiner*—Magid Y Dimyan
(74) *Attorney, Agent, or Firm*—Staas & Halsey LLP

(57) ABSTRACT

In an LSI analysis apparatus, a logic element pair extracting unit extracts an unselected logic element pair when an input unit receives circuit description input. A searching unit searches for an input pattern causing the extracted pair to perform concurrent transition. When an input pattern causing concurrent transition is found, the searching unit determines the extracted pair to be a pair capable of concurrent transition (concurrent transition pair), and holds the input pattern causing concurrent transition. When an input pattern causing concurrent transition is not found, the searching unit determines the extracted pair to be a non-concurrent transition pair. An input pattern operation ratio calculating unit calculates an input pattern operation ratio for each input pattern causing concurrent transition. A detecting unit detects an input pattern yielding the highest input pattern operation ratio. An output unit puts out the detected input pattern, non-concurrent transition pairs, etc.

6 Claims, 10 Drawing Sheets

| LOGIC ELEMENT PAIR | SIGNAL TRANSITION PAIR | CONCURRENT TRANSITION | INPUT PATTERN | |
|---|---|---|---|---|
| G1, G2 | RISE, RISE | NO | IN=1->1,Q(t=0)=0 | ← P1 |
|  | RISE, FALL | YES | | |
| G1, G3 | RISE, RISE | NO | NONE | |
|  | RISE, FALL | NO | | |
|  | FALL, RISE | NO | | |
|  | FALL, RISE | NO | | |
| G1, FF | RISE, FALL | YES | IN=1->1,Q(t=0)=0 | ← P1 |
| G2, G3 | RISE, RISE | YES | IN=0->1,Q(t=0)=0 | ← P2 |
| G2, FF | RISE, RISE | NO | IN=1->1,Q(t=0)=0 | ← P1 |
|  | RISE, FALL | NO | | |
|  | FALL, RISE | YES | | |
| G3, FF | RISE, RISE | NO | NONE | |
|  | RISE, FALL | NO | | |
|  | FALL, RISE | NO | | |
|  | FALL, FALL | NO | | |

LSI ANALYSIS METHOD, LSI ANALYSIS APPARATUS, AND COMPUTER PRODUCT

CROSS-REFERENCE TO RELATED APPLICATIONS

This application is based upon and claims the benefit of priority from the prior Japanese Patent Application No. 2006-152317, filed on May 31, 2006, the entire contents of which are incorporated herein by reference.

BACKGROUND OF THE INVENTION

1. Field of the Invention

The present invention relates to a technology for large scale integration (LSI) to analyze the highest operation ratio of an LSI in verification of power source design.

2. Description of the Related Art

Greater efficiency through shorter design verification periods is demanded in the design of LSIs; yet verification of proper operation of an LSI is imperative. Verification work is particularly essential for an LSI that is to meet greater demands in scale, function, faster processing speed, and reduced power consumption, while sustaining high quality.

Particularly, in verification of power source design for an LSI, a designer has a desire to confirm that power supply through a designed power line is problem-free even if the LSI shows a highest operation rate. As micro fabrication technology for LSIs progresses, a conventional LSI often has a problem with power supply, a problem that is addressed by the insertion of decoupling capacitors into the LSI.

Currently, however, in many cases, a decoupling capacitor quantity is determined by analysis, independent of simulation or patterns (analysis with the assumption that the entire LSI operates). Hence, suitability of the inserted decoupling capacitor quantity is unclear.

Conventional techniques for verification of power source design have been disclosed and include a simulation or emulation using random number patterns or functional verification patterns (see, e.g., nonpatent document 1: "Full-Chip Verification Methods for DSM Power Distribution Systems", Design Automation Conference, 1998, pp. 744-749), a static power noise analysis that does not employ patterns (see, e.g., nonpatent document 2: "Pattern Independent Highest Current Estimation in Power and Ground Buses of CMOS VLSI Circuits: Algorithms, Signal Correlations, and Their Resolutions", IEEE Translations on Computer-Aided Design, 1995, Vol. 14, No. 8, pp. 998-1012), and a generation of a pattern yielding a highest operation ratio (see, e.g., nonpatent document 3: "Vector Generation for Highest Instantaneous Through Supply Lines for CMOS Circuits", Design Automation Conference, 1997, pp. 383-388).

With the above conventional verification techniques, however, suitability of the decoupling capacitor quantity is unclear. An insufficient quantity results in functional deficiency, thus degrading the quality of the LSI. To compensate, estimated quantities tend to be increased. However, an excessive quantity leads to a larger chip area, which poses a problem of increased manufacturing cost.

Furthermore, a designer depends on her experience, skill, and intuition in determining a proper decoupling capacitor quantity. As a result, the determined quantity may vary according to designer, thus potentially resulting in reduced quality and increased manufacturing cost.

The conventional technique disclosed in the nonpatent document 1 requires a great deal of time for simulation and emulation, raising a problem of a longer design period. In addition, the technique requires an enormous pattern space, which brings about a problem of difficulty in determining whether a tested operation ratio is large.

The conventional technique disclosed in the nonpatent document 2 features a power noise analysis based on the assumption that the entire LSI operates. Estimated noise volume, therefore tends to be greater, leading to a larger decoupling capacitor quantity and increased chip area, thereby pushing up manufacturing costs.

The conventional technique disclosed in the nonpatent document 3 employs a method of increasing concurrent operation nodes while executing an automatic test pattern generation (ATPG) and an exhaustive solution search by a branch and bound algorithm. This method makes it difficult to obtain the highest operation ratio of an LSI. The technique, therefore, poses a problem of difficulty in verifying whether a power supply problem exists at a highest operation ratio.

SUMMARY OF THE INVENTION

It is an object of the present invention to at least solve the above problems in the conventional technologies.

A computer-readable recording medium according to one aspect of the present invention stores therein an large-scale integration (LSI) analysis program. The LSI analysis program causes a computer to execute receiving circuit description of a design subject circuit; extracting logic element pairs from among the circuit description; searching for an input pattern for each logic element pair, the input pattern causing the logic element pair to perform concurrent transition; calculating an operation ratio for each of the input patterns; detecting an input pattern yielding a highest operation ratio from among the calculated operation ratios; and outputting the detected input pattern.

A computer-readable recording medium according to another aspect of the invention stores therein an LSI analysis program. The LSI analysis program causes a computer to execute receiving circuit description of a design subject circuit; extracting logic element pairs from the circuit description; searching for an input pattern for each of the logic element pairs, the input pattern causing the logic element pair to perform concurrent transition; calculating an operation ratio of the input pattern; detecting an input pattern yielding a highest operation ratio from among the calculated operation ratios; generating a graph indicating a concurrent transition relationship between logic elements in the logic element pair, based on the input pattern; extracting a subgraph including a highest quantity of logic elements from among subgraphs each of which includes a group of logic elements that perform concurrent transition in the graph; calculating an operation ratio of the group in the extracted subgraph; and outputting the calculated operation ratio of the group.

An LSI analysis apparatus according to still another aspect of the present invention includes a receiving unit that receives circuit description of a design subject circuit; an extracting unit that extracts logic element pairs from among the circuit description; a searching unit that searches for an input pattern for each logic element pair, the input pattern causing the logic element pair to perform concurrent transition; a calculating unit that calculates an operation ratio for each of the input patterns; a detecting unit that detects an input pattern yielding a highest operation ratio from among the calculated operation ratios; and an output unit that outputs the detected input pattern.

An LSI analysis apparatus according to still another aspect of the present invention includes a receiving unit that receives circuit description of a design subject circuit; an extracting unit that extracts logic element pairs from the circuit description; a searching unit that searches for an input pattern for each of the logic element pairs, the input pattern causing the logic element pair to perform concurrent transition; a calculating unit that calculates an operation ratio of the input pattern; a detecting unit that detects an input pattern yielding a highest operation ratio from among the calculated operation ratios; a generating unit that generates a graph indicating a concurrent transition relationship between logic elements in the logic element pair, based on the input pattern; an extracting unit that extracts a subgraph including a highest quantity of logic elements from among subgraphs each of which includes a group of logic elements that perform concurrent transition in the graph; a calculating unit that calculates an operation ratio of the group in the extracted subgraph; and an outputting unit that outputs the calculated operation ratio of the group.

An LSI analysis method according to still another aspect of the present invention includes receiving circuit description of a design subject circuit; extracts logic element pairs from among the circuit description; searching for an input pattern for each logic element pair, the input pattern causing the logic element pair to perform concurrent transition; calculating an operation ratio for each of the input patterns; detects an input pattern yielding a highest operation ratio from among the calculated operation ratios; and outputting the detected input pattern.

An LSI analysis method according to still another aspect of the present invention includes receiving circuit description of a design subject circuit; extracting logic element pairs from the circuit description; searching for an input pattern for each of the logic element pairs, the input pattern causing the logic element pair to perform concurrent transition; calculating an operation ratio of the input pattern; detecting an input pattern yielding a highest operation ratio from among the calculated operation ratios; generating a graph indicating a concurrent transition relationship between logic elements in the logic element pair, based on the input pattern; extracting a subgraph including a highest quantity of logic elements from among subgraphs each of which includes a group of logic elements that perform concurrent transition in the graph; calculating an operation ratio of the group in the extracted subgraph; and outputting the calculated operation ratio of the group.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will now be described in detail with reference to the accompanying drawings.

Figure 1:
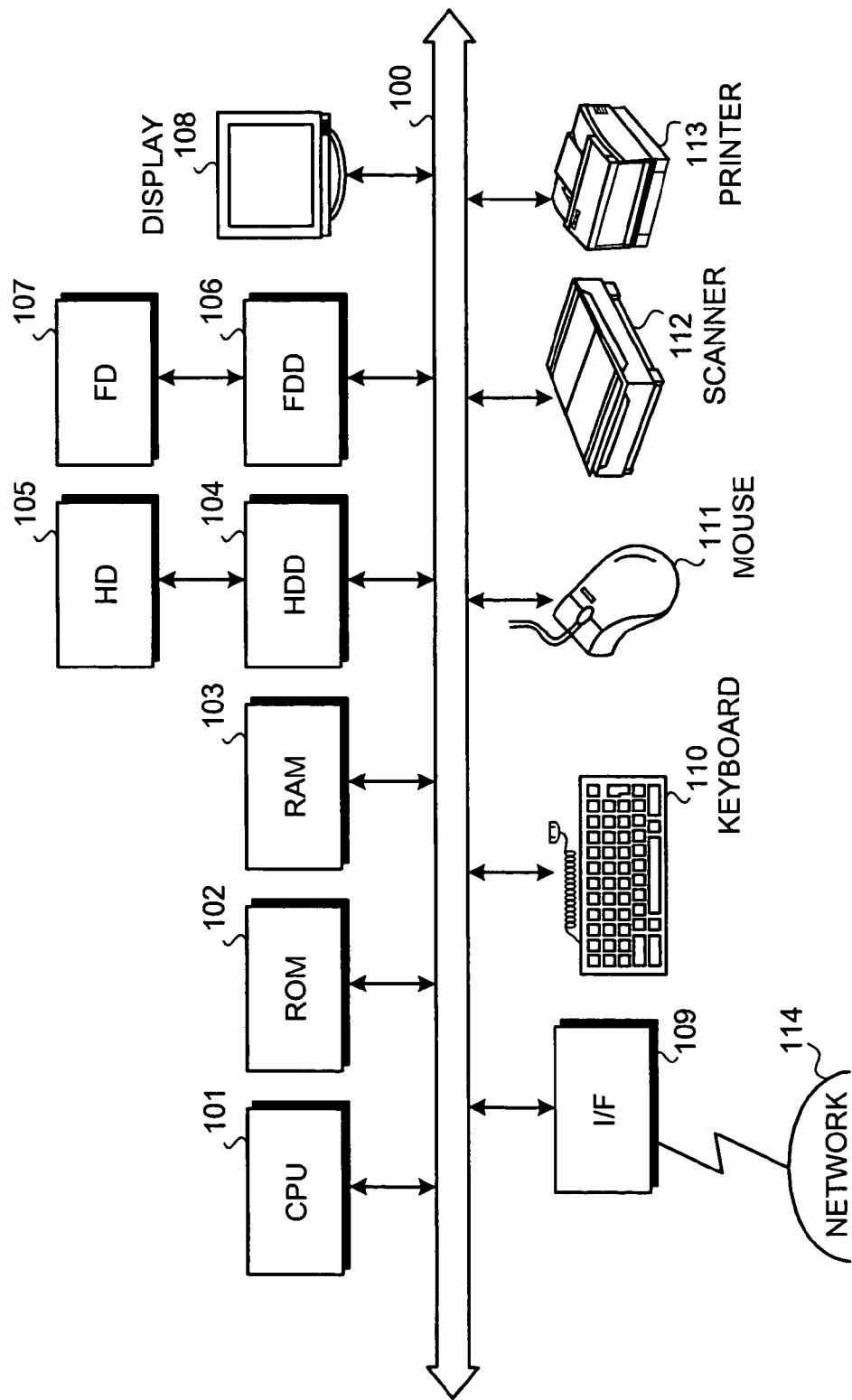
FIG. 1 is a schematic diagram of an LSI analysis apparatus according to an embodiment of the present invention.

FIG. 1 is a block diagram of the an LSI analysis apparatus according to an embodiment of the present invention.

As illustrated in FIG. 1, the LSI analysis apparatus includes a central processing unit (CPU) 101, a read-only memory (ROM) 102, a ROM 103, a hard disk drive (HDD) 104, a hard disk (HD) 105, a flexible disk drive (FDD) 106, a flexible (FD) 107 (e.g., a removable recording medium), a display 108, an interface (I/F) 109, a keyboard 110, a mouse 111, a scanner 112, and a printer 113. These components are interconnected via a bus 100.

The CPU 101 governs control over the entire LSI analysis apparatus. The ROM 102 stores programs including a boot program. The RAM 103 is used as a work area for the CPU 101. The HDD 104 follows instructions from the CPU 101 to control data reading/writing on the HD 105. The HD 105 stores data written thereon under the control of the HDD 104.

The FDD 106 follows instructions from the CPU 101 to control data reading/writing on the FD 107. The FD 107 stores data written thereon under the control of the FDD 106, and allows the LSI analysis apparatus to read data stored in the FD 107.

The FD 107 serving as a removable recording medium may be replaced by a compact disk record only memory (CD-ROM) (or compact disk recordable (CD-R), compact disk rewriteable (CD-RW)), magneto optical disk (MO), digital versatile disk (DVD), memory card, etc. The display 108 displays a cursor, icons, tool boxes, and other data for documents, images, and functional information. For example, a cathode-ray tube (CRT), thin-film transistor (TFT) crystal display, or plasma display can be employed as the display 108.

The I/F 109 is connected to a network 114, such as the Internet, via a communication line, and is connected to an external device via the network 114. The I/F 109 assumes control over the network 114 and internal interfaces to control data input/output from/to the external device. For example, a modem or LAN adaptor can be employed as the I/F 109.

The keyboard 110 has keys for entering characters, numerals, various instructions, etc., serving to input data. The keyboard 110 may be replaced with a touch-panel-type input pad or a numeric keypad. The mouse 111 is used to move a cursor, select a range, move a window, change a window size, etc. The mouse 111 may be replaced with another pointing device having the same function as the mouse 111, such as a track ball, joy stick, etc.

The scanner 112 optically reads an image into the LSI analysis apparatus. The scanner 112 may be provided with an optical character recognition (OCR) function. The printer 113 prints out image data or document data. For example, a laser printer or ink jet printer can be employed as the printer 113.

Figure 2:
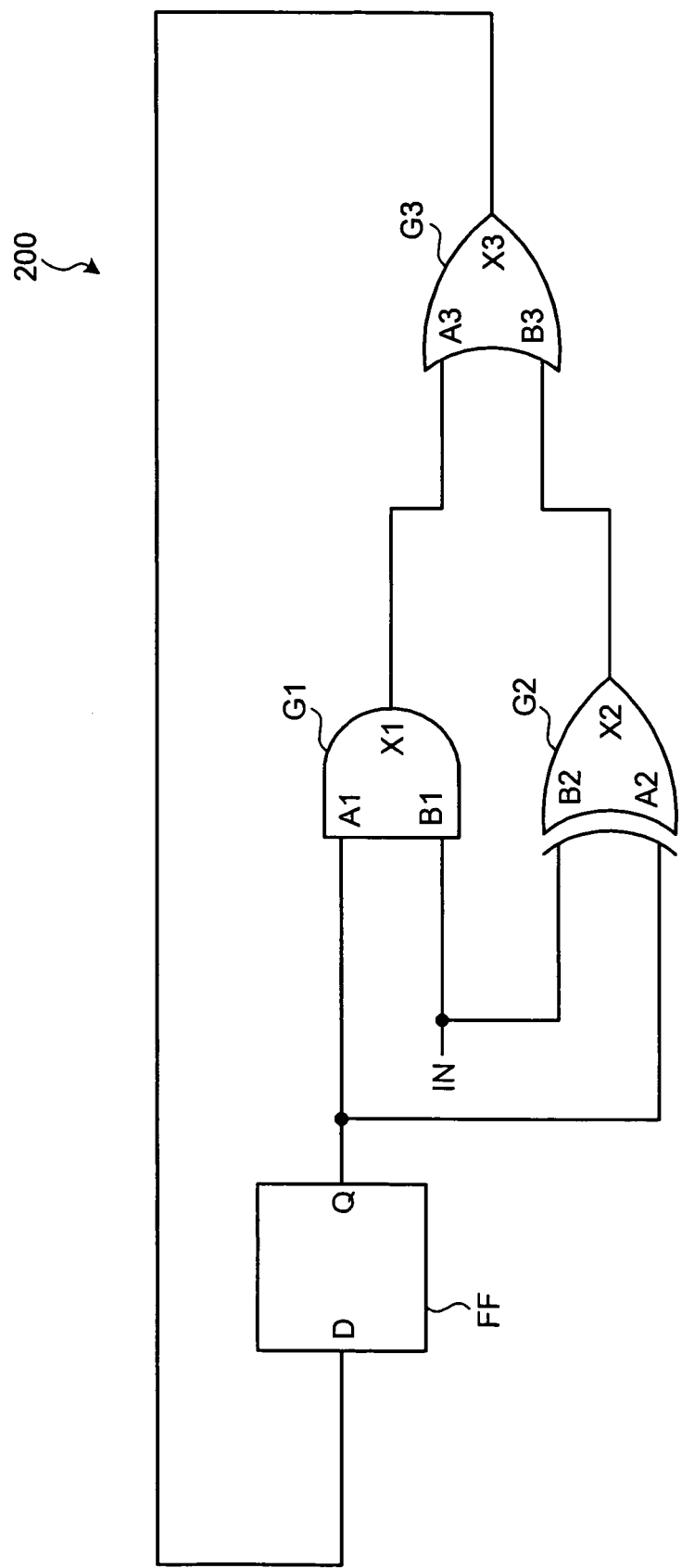
FIG. 2 is a circuit diagram of a design subject circuit analyzed by the LSI analysis apparatus.

FIG. 2 is a circuit diagram of an example of a circuit design subject analyzed by the LSI analysis apparatus according to the embodiment of the present invention.

A circuit design subject 200 is constructed by combining various logic elements. The circuit design subject 200 described in the present embodiment is actually composed of several hundreds of thousands to scores of millions of logic elements, but the construction of the circuit design subject 200 is simplified here for convenience in explanation.

As illustrated in FIG. 2, the circuit design subject 200 includes a flip-flop element FF, a logic gate G1 representing an AND element, a logic gate G2 representing an Exclusive OR (XOR) circuit, and a logic gate G3 representing an OR element. Output Q from the flip-flop element FF is connected to input A1 of the logic gate G1, and to input A2 of the logic gate G2. External input IN is connected to input B1 of the logic gate G1, and to the input B2 of the logic gate G2. Output X1 from the logic gate G1 and output X2 from the logic gate G2 are connected to input A3 and B3 of the logic gate G3, respectively. Output X3 from the logic gate G3 is fed back into input D of the flip-flop element FF.

Figure 3:
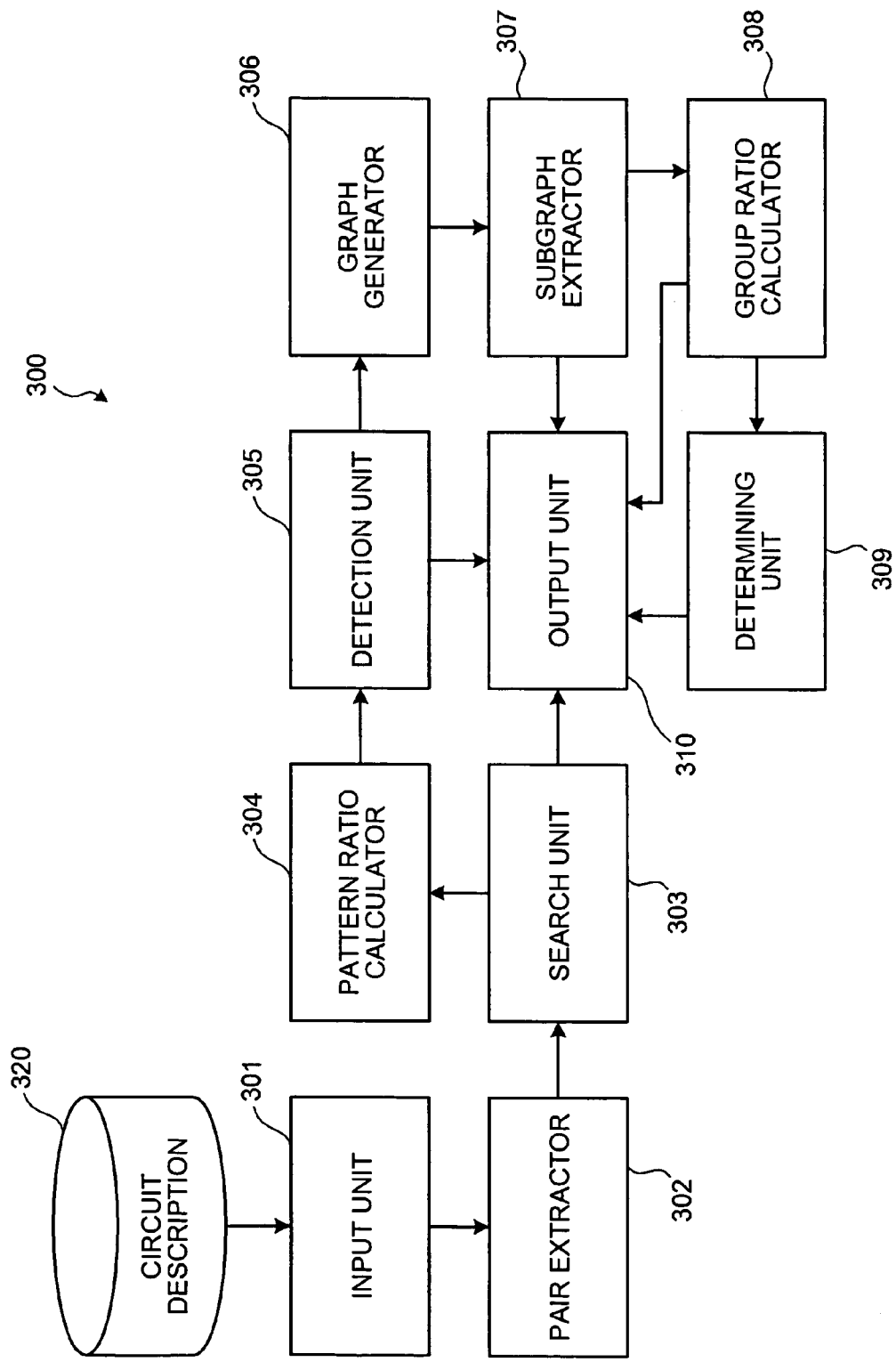
FIG. 3 is a block diagram of the LSI analysis apparatus.

FIG. 3 is a block diagram of the functional structure of the LSI analysis apparatus according to the embodiment of the present invention. In FIG. 3, circuit description 320 represents information that describes connections between elements in the circuit design subject 200 based on a logical synthesis result. For example, the circuit description 320 is provided as a net list that expresses inter-element connection in the circuit design subject 200 in the form of text data. Therefore, in the case of the circuit design subject 200 illustrated in FIG. 2, the circuit description 320 contains a description of the logic elements FF, G1 to G3, and connections between the logic elements.

As illustrated in FIG. 3, the LSI analysis apparatus 300 includes an input unit 301, a pair extractor 302, a search unit 303, a pattern ratio calculator 304, a detection unit 305, a graph generator 306, a subgraph extractor 307, a group ratio calculator 308, a determining unit 309, and an output unit 310.

According to the present embodiment, the input unit 301, the pair extractor 302, the search unit 303, the pattern ratio calculator 304, and the detection unit 305 jointly constitute a functional unit that executes analysis of concurrent operation of a logic element pair. The graph generator 306, the subgraph extractor 307, the group ratio calculator 308, and determining unit 309 jointly constitute a functional unit that executes analysis of the highest operation ratio of the entire circuit design subject 200.

According to the present embodiment, the analysis of concurrent operation of a logic element pair is separated functionally from the analysis of the highest operation ratio of the entire circuit design subject 200. This allows separation of a search for an input pattern space from a search for a concurrent operation gate group on the circuit. As a result, LSI analysis is simplified, and can be applied to a large-scale circuit. A detailed description of the functional structure of the LSI analysis apparatus follows.

The input unit 301 receives input from the circuit description 320. For example, the input unit 301 reads a net list of the circuit design subject 200 illustrated in FIG. 2. The input unit 301 also receives clock information and input restricting information. The clock information is information about clock pins and clock frequencies. When a plurality of clocks is present, the clock information is necessary to know the relationship between the clocks and understand the exact operation of a sequence circuit.

The input restricting information is information for restricting input/output at logic circuits in the circuit design subject 200. The input restricting information includes such descriptions as "this input value is fixed at 0" and "a combination of this input value and that input value cannot be (0, 0)". The input restricting information allows calculation of a practical highest operation ratio that is determined in consideration of analysis for each mode and circuit limitation. The input restricting information also contributes to a reduction in input pattern space, thus improving analysis efficiency.

The pair extractor 302 extracts logic element pairs from the circuit description 320. Specifically, the pair extractor 302 extracts a logic element pair of gate elements, of a flip-flop element and a gate element, of flip-flop elements, etc. Logic elements composing an extracted pair are not necessarily connected directly to each other. From the circuit design subject 200 illustrated in FIG. 2, for example, logic element pairs of {FF, G1}, {FF, G2}, {FF, G3}, {G1, G2}, {G1, G3}, and {G2, G3} are extracted.

The search unit 303 searches each logic element pair extracted by the pair extractor 302 for an input pattern that causes the logic element pair to perform concurrent transition. Specifically, the search unit 303 determines for each logic element pair whether concurrent transition is possible with regard to signal transition pairs of up to four patterns in combination of rises and falls.

When a logic element pair is capable of concurrent transition, the search unit 303 retains an input pattern causing the concurrent transition as a search result. When a logic element pair is incapable of concurrent transition, the search unit 303 determines the logic element pair to be a non-concurrent transition pair, and puts it out as a search result. Inserting a decoupling capacitor into a non-concurrent transition pair does not provide a solution to a power supply problem. However, identification of non-concurrent transition pairs in advance, prevents unnecessary insertion of decoupling capacitors, enabling a reduction in the chip area and manufacturing cost of the circuit design subject 200.

Figure 4:
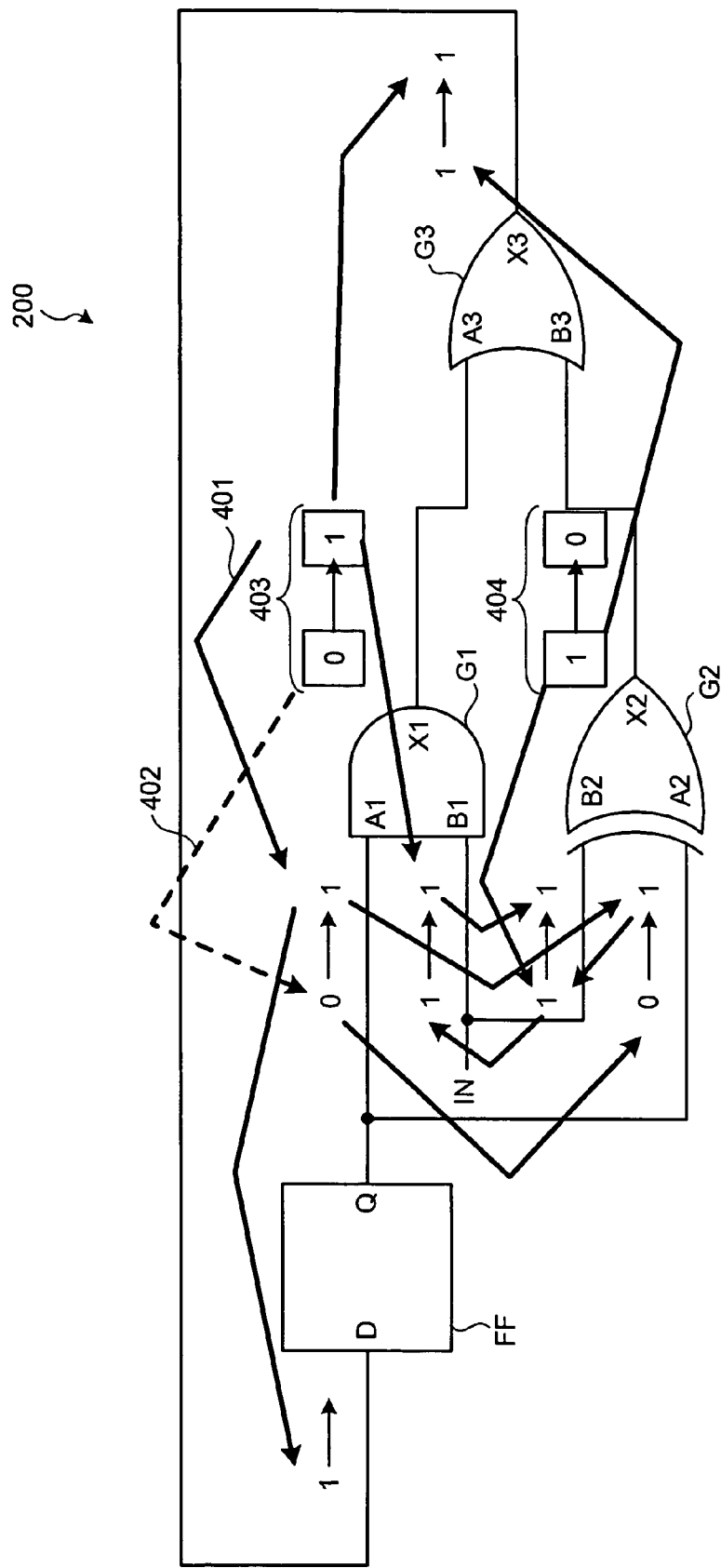
FIG. 4 is an explanatory view of a search result that is given when the possibility of concurrent transition is determined in the design subject circuit.

FIG. 4 is an explanatory view of a search result that is given when the possibility of concurrent transition is determined in the circuit design subject 200. In FIG. 4, each combination of two numerical values across an arrow (0→1, 1→1, 1→0, etc.) expresses a signal transition. Specifically, a numerical value at the start of an arrow represents a signal value at time t=0, while a numerical value at the termination of the arrow represents a signal value at time t=1.

Each bold arrow illustrated in FIG. 4 expresses an implication. An implication means a relationship in which a given one value determines the other value implicitly. An implication is also referred to as implication operation. For example, at a bold arrow 401, the start of the arrow gives output X1=1 from the logic gate G1. This output X1=1 from the logic gate G1 automatically determines input A1 to the logic gate G1 to be A1=1, which indicates the termination of the bold arrow 401.

A bold dotted line arrow 402 illustrated in FIG. 4 expresses value allocation by selection. For example, the start of the bold dotted line arrow 402 expresses that output X1 from the logic gate G1 at time t=0 is given as X1=0 and leads to two values, "0" and "1", that can be allocated to output Q from the flip-flop element FF at time t=0, indicating the termination of the bold dotted line arrow 402. In FIG. 4, "0" is selected as the value allocated to the output Q from the flip-flop element FF.

FIG. 4 shows a case where a pair of the logic gates G1, G2 is selected. In this case, a signal transition 403 at the logic gate G1 is presumed to be a rise, and a signal transition 404 at the gate G2 is presumed to be a fall. This means that the signal transition 403 at the logic gate G1 results in value allocation of output X1=0 at time t=0 and output X1=1 at time t=1. Likewise, the signal transition 404 at the logic gate G2 results in value allocation of output X2=1 at time t=0 and output X2=0 at time t=1.

An input pattern causing concurrent signal transitions 403, 404 is searched for by implication operation. In the case illustrated in FIG. 4, the input pattern causing concurrent signal transitions 403, 404 is:

IN (t=0)=1
IN (t=1)=1
Q=(t=1)=0

For the output Q from the flip-flop element FF, this input pattern includes only the value given at time t=0 in the initial state because the value of the output Q from the flip-flop element FF at time t=1 can be derived from the input pattern.

Figure 5:
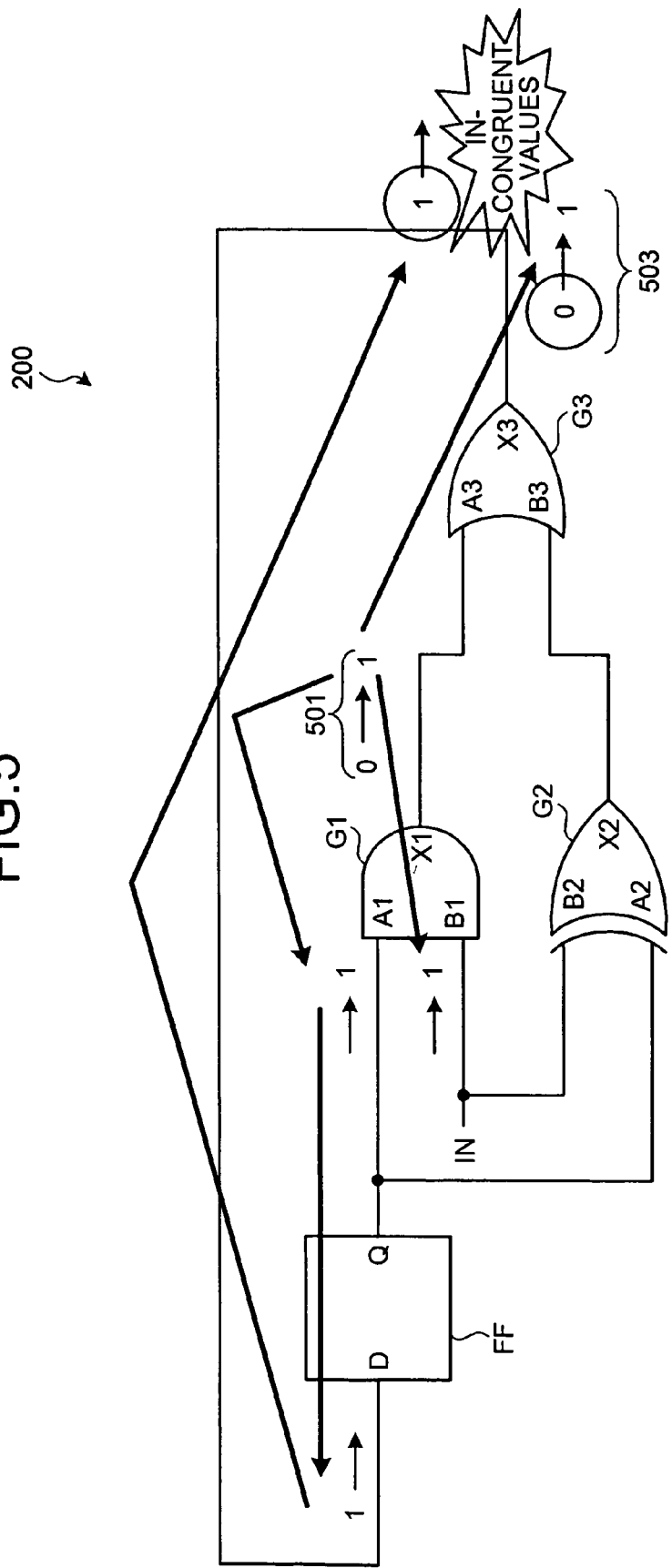
FIG. 5 is an explanatory view of a search result that is given when the impossibility of concurrent transition is determined in the design subject circuit.

FIG. 5 is an explanatory view of a search result given when the impossibility of concurrent transition is determined in the circuit design subject 200. In FIG. 5, arrows and bold arrows represent the same conditions as in FIG. 4, hence further explanation of these arrows is omitted.

FIG. 5 depicts a case where a pair of the logic gates G1, G3 is selected. In this case, a signal transition 501 at the logic gate G1 is presumed to be a rise, and a signal transition 503 at the gate G3 is presumed to be a rise. This means that the signal transition 501 at the logic gate G1 results in value allocation of output X1=0 at time t=0 and output X1=1 at time t=1. Likewise, the signal transition 503 at the logic gate G3 results in value allocation of output X3=0 at time t=0 and output X3=1 at time t=1.

As illustrated in FIG. 5, implication operation from the signal transition 501 determines input D to the flip-flop element FF to be D=1 at time t=0. Meanwhile, output X3 from the logic gate G3 at time t=0 is X3=0. D=1 at the input D and X3=0 at the output X3 contradict with each other. Selection of the pair of logic gates G1, G3, therefore, does not allow concurrent transition in a combination of the signal transitions 501, 503.

Figures 6, 7:
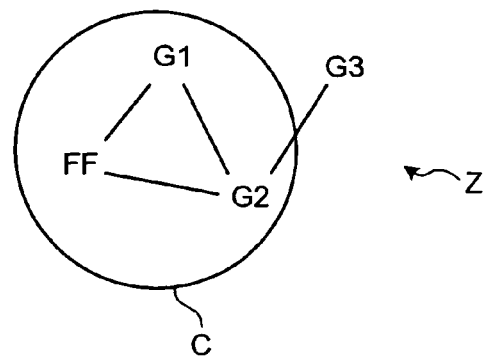
FIG. 6 is a table of search results given by the search unit 303.
FIG. 7 illustrates a concurrent transition relation graph of the design subject circuit.

FIG. 6 is a graphic chart of search results given by the search unit 303. FIG. 6 depicts a search result for every signal transition pair of every logic element pair in the circuit design subject 200. As illustrated in FIG. 6, an input pattern P1 is found for logic element pairs of {G1, G2}, {G1, FF}, {G2, FF}, and an input pattern P2 is found for a logic element pair of {G2, G3}.

In a signal transition pair column illustrated in FIG. 6, "Rise" means "0→1", that is, a signal value is 0 at time t=0 and becomes 1 at time t=1. "Fall" means "1→0", that is, a signal value is 1 at time t=0 and becomes 0 at time t=1. In FIG. 6, a logic element pair yielding a signal transition pair marked with a circle in a concurrent transition column is a concurrent transition pair, and a logic element pair yielding a signal transition pair marked with a cross is a non-concurrent transition pair.

In FIG. 3, the pattern ratio calculator 304 calculates an operation ratio (input pattern operation ratio) for each input pattern on the basis of an input pattern found by the search unit 303. Specifically, the number of logic elements performing signal transition, the number being obtained from the input pattern, is divided by the total number of logic elements in the circuit design subject 200 to calculate an input pattern operation ratio for each input pattern. In the case of the circuit design subject 200, an input pattern operation ratio is calculated for each input pattern P1 and P2.

For example, when the input pattern P1 is given, logic element pairs performing concurrent transition are {G1, G2}, {G1, FF}, {G2, FF}. This gives three logic elements performing concurrent transition, which consist of the logic gates GF1, G2 and the flip-flop element FF. Since the total logic element number in the LSI, i.e., the circuit design subject 200, is four, an input pattern operation ratio R1 of the input pattern P1 is calculated at R1=3/4.

In the same manner, when the input pattern P2 is given, a logic circuit pair performing concurrent transition is {G2, G3}. This gives two logic circuits performing concurrent transition, which consist of the logic gates G2, G3. Since the total logic circuit number in the LSI is four, an input pattern operation ratio R2 of the input pattern P2 is calculated at R2=2/4.

The detection unit 305 detects an input pattern yielding a highest input pattern operation ratio from a group of input patterns. Hereinafter, an input pattern operation ratio of an input pattern detected by the detection unit 305 is called the highest input pattern operation ratio Rp. The input pattern operation ratio R1 of the input pattern P1 illustrated in FIG. 6 is calculated at R1=3/4, and the input pattern operation ratio R2 of the input pattern P2 is calculated at R2=2/4. In this case, therefore, the highest input pattern operation ratio Rp is the input pattern operation ratio R1. The detection unit 305 thus detects the input pattern P1. The highest input pattern operation ratio Rp constitutes the lower limit to the highest operation ratio of the circuit design subject 200.

An input pattern yielding the highest input pattern operation ratio Rp allows power supply verification under a condition of a greater operation ratio. This enables a designer to determine suitability of a decoupling capacitor quantity.

The graph generator 306 makes a concurrent transition relationship graph indicating the concurrent transition relationship between logic elements on the basis of input patterns found by the search unit 303. In the concurrent transition relationship graph, logic elements form nodes, and possible concurrent transition relationships form edges.

FIG. 7 is an explanatory view of a concurrent transition relationship graph of the circuit design subject 200. The input pattern P1 causes logic elements of the logic gates G1, G2 and the flip-flop element FF to perform mutual concurrent transition. In the concurrent transition relationship graph Z, therefore the logic gates G1, G2 and the flip-flop element FF are interconnected via edges. Likewise, the input pattern P2 causes a logic element of the logic gates G2, G3 to perform mutual concurrent transition.

In the concurrent transition relation graph Z, therefore, the logic gates G2, G3 are interconnected via an edge. As illustrated in FIG. 5, the logic gates G1, G3 do not perform concurrent transition, and, therefore, are not connected via an edge. Likewise, not performing concurrent transition, the logic gate G3 and the flip-flop element FF are not connected via an edge.

The subgraph extractor 307 illustrated in FIG. 3, from a concurrent transition relationship graph made by the graph generator 306, extracts a subgraph that includes the highest number of logic elements from among all subgraphs. A subgraph includes a group of logic elements performing mutual concurrent transition.

Specifically, according to the concurrent transition relationship graph Z illustrated in FIG. 7, a group of logic elements performing mutual concurrent transition are {G1, G2, FF}. This logic element group is a subgraph C. FIG. 7 depicts no other subgraphs than the subgraph C. In this case, therefore, the subgraph C is the subgraph including the highest number of logic elements, which is extracted by the subgraph extractor 307.

The group ratio calculator 308 calculates an operation ratio of a logic element group included in a subgraph extracted by the subgraph extractor 307. Specifically, a logic circuit (element) group operation ratio Rs is given by the equation: Rs=m/n, where the number of logic elements in a subgraph is m, and the total number of logic elements in the circuit design subject 200 is n.

This logic circuit group operation ratio Rs constitutes the upper limit to the highest operation ratio of the circuit design subject 200. In the case of the circuit design subject 200, the number of logic elements in the subgraph C is given as m=3 and the total number of logic elements in the LSI is given as n=4. The logic circuit group operation ratio Rs is, therefore, calculated at R=3/4.

Based on a calculation result given by the group ratio calculator 308, the determining unit 309 determines an input pattern detected by the detection unit 305 to be the input pattern that gives the circuit design subject 200 the highest operation ratio.

Specifically, when a difference between a logic circuit group operation ratio Rs and a highest input pattern operation ratio Rp is a given threshold Rt or less (Rt≧0), the determining unit 309 takes the highest input pattern operation ratio Rp to be reliable, and determines the input pattern detected by the detection unit 305 to be the input pattern that gives the circuit design subject 200 the highest operation ratio.

For example, according to the circuit design subject 200, both the logic circuit group operation ratio Rs and the input pattern operation ratio R1 are calculated at 3/4, which gives a difference of zero between Rs and R1, i.e., the difference between the logic circuit group operation ratio Rs and the highest input pattern operation ratio Rp (R1) is the given threshold Rt or less. Hence the determining unit 309 determines the input pattern P1 to be the input pattern that gives the LSI the highest operation ratio.

The output unit 310 puts out various pieces of information. Specifically, the output unit 310 puts out, for example, an input pattern detected by the detection unit 305, a logic element pair (non-concurrent transition pair) where no input pattern is found by the search unit 303, a logic element group operation ratio Rs calculated by the group ratio calculator 308, a logic element group yielding the logic element group operation ratio Rs (e.g., the logic elements G1, G2, FF in the subgraph C), and an input pattern determined by the determining unit 309.

The output unit 310 puts out information in any one of such forms as screen display by the display 108, print-out by the printer 113, data output (storage) to the RAM 103 or the HD 105, and transmission to another computer.

The above input unit 301, the pair extractor 302, the search unit 303, the pattern ratio calculator 304, the detection unit 305, the graph generator 306, the subgraph extractor 307, the group ratio calculator 308, the determining unit 309, and the output unit 310 execute their functions, for example, as the CPU 101 executes programs stored in the ROM 102, the RAM 103, the HD 105, the FD 107, etc., illustrated in FIG. 1, or by the I/F 109.

Figure 8:
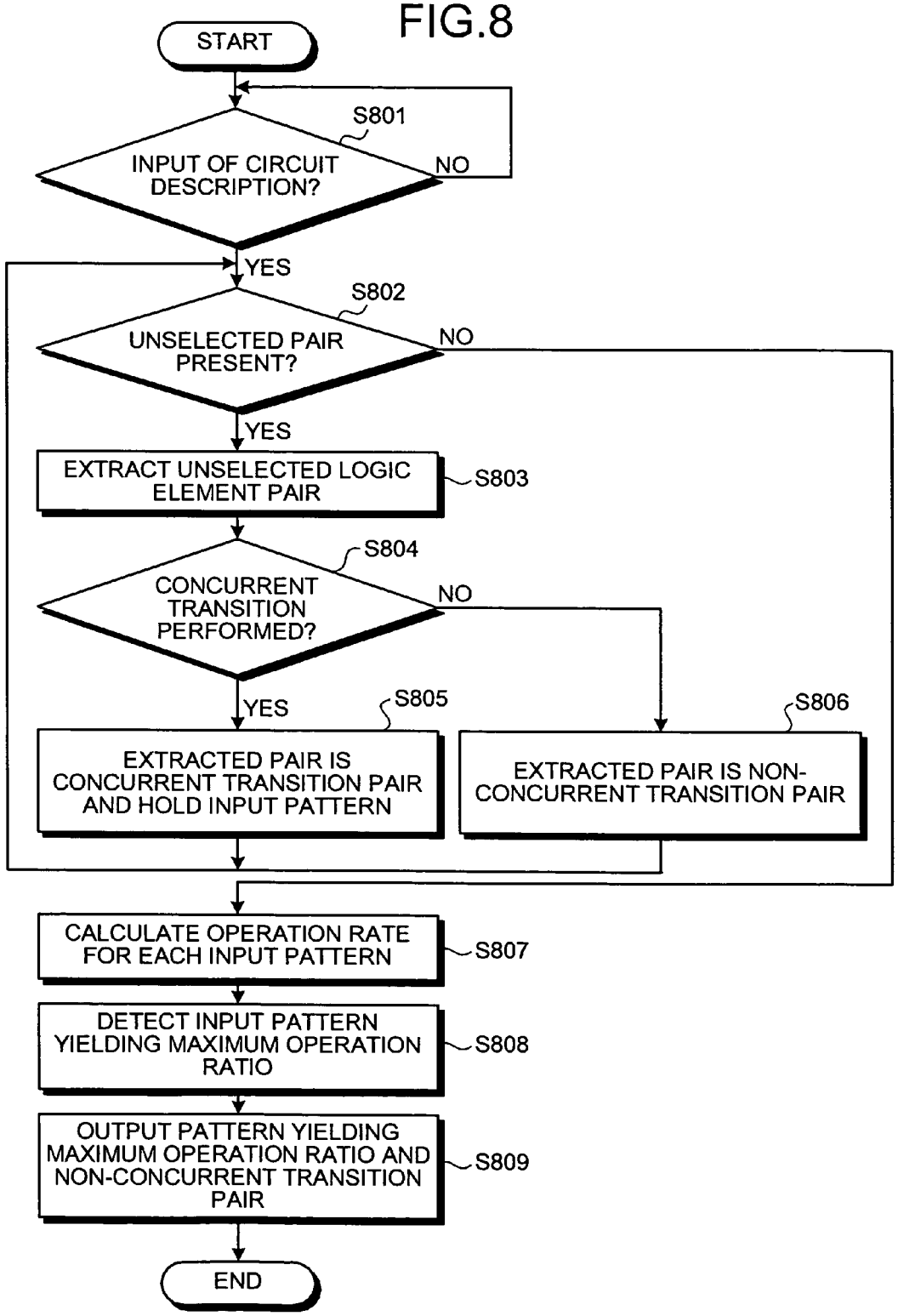
FIG. 8 is a flowchart of an analysis of concurrent operation of logic element pairs according to the embodiment.

FIG. 8 is a flowchart of a process procedure for an analysis of concurrent operation of logic element pairs according to the embodiment of the present invention. As illustrated in FIG. 8, the input unit 301 awaits input of the circuit description 302 (NO at step S801). Upon receipt of the circuit description 302 (YES at step S801), the input unit 301 determines whether an unselected logic element pair is present (step S802).

Upon an unselected logic element pair being present (YES at step S802), the pair extractor 302 extracts the unselected logic element pair (step S803). Hereinafter, an extracted logic element pair is called "extracted pair".

Subsequently, the search unit 303 searches for an input pattern that causes an extracted pair to perform concurrent transition (step S804). When an input pattern causing concurrent transition is present (YES at step S804), the extracted pair is determined to be a pair capable of concurrent transition (concurrent transition pair), and the input pattern causing concurrent transition is held in the RAM 103 or the HD 105 (step S805). The process procedure then returns to step S802.

Upon an input pattern causing concurrent transition not being present (NO at step S804), the extracted pair is determined to be a pair incapable of concurrent transition (non-concurrent transition pair) (step S806). The process procedure then returns to step S802.

Upon an unselected logic element pair not being present (NO at step S802), the pattern ratio calculator 304 calculates an input pattern operation ratio for each input pattern causing concurrent transition (step S807). Following this, the detection unit 305 detects an input pattern yielding a highest input pattern operation ratio (step S808). As indicated in the graphic chart in FIG. 6, the input pattern operation ratio R1 given by the input pattern P1 is highest (R1=3/4), hence the detection unit 305 detects the input pattern P1.

The output unit 301 then puts out the detected input pattern, the non-concurrent transition pair, etc. (step S809). In this manner, an input pattern yielding a highest input pattern operation ratio allows optimal execution of power supply verification on the circuit design subject 200, which enables a designer to determine the appropriateness of an inserted quantity of decoupling capacitors.

In addition, outputting a non-concurrent transition pair in advance prevents unnecessary insertion of a decoupling capacitor. This enables a reduction in the chip area and manufacturing cost of the circuit design subject 200.

According to the above process procedure for LSI analysis, the lower limit of the highest operation ratio of the entire circuit design subject 200 (highest input pattern operation ratio Rp) can be obtained through analysis of only concurrent operation of logic element pairs, thereby eliminating a need for analysis for an operation ratio of the entire circuit design subject 200 and shortening a design period.

A process procedure for LSI analysis is described. This process procedure is conducted to analyze the highest operation ratio of the entire circuit design subject 200 subsequent to the above analysis of concurrent operation of logic element pairs.

The analysis of the highest operation ratio of the entire circuit design subject 200 provides the upper limit to the highest operation ratio of the entire circuit design subject 200. This improves the precision of the lower limit (highest input pattern operation ratio Rp) to the highest operation ratio of the entire circuit design subject 200. The lower limit is obtained through the analysis of concurrent operation of logic element pairs.

Figure 9:
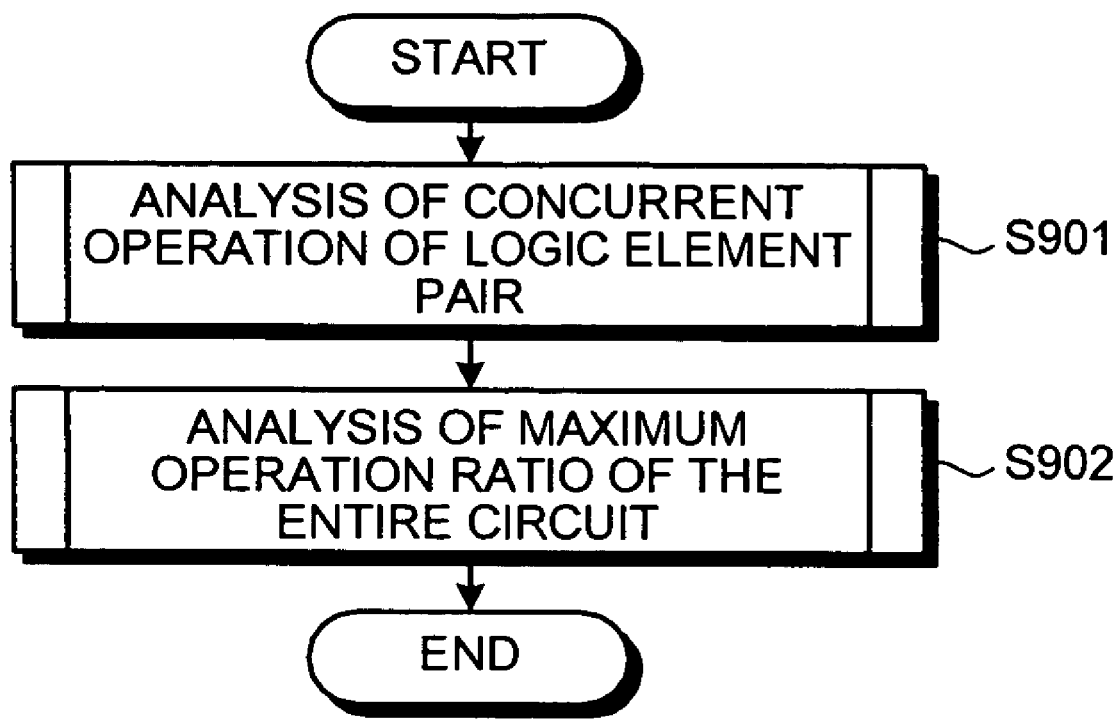
FIG. 9 is a flowchart of an LSI analysis.

FIG. 9 is a flowchart of the process procedure for the LSI analysis. As illustrated in FIG. 9, the analysis of concurrent operation of logic element pairs is executed first (step S901), and then the analysis of the highest operation ratio of the entire circuit is executed (step S902).

Figure 10:
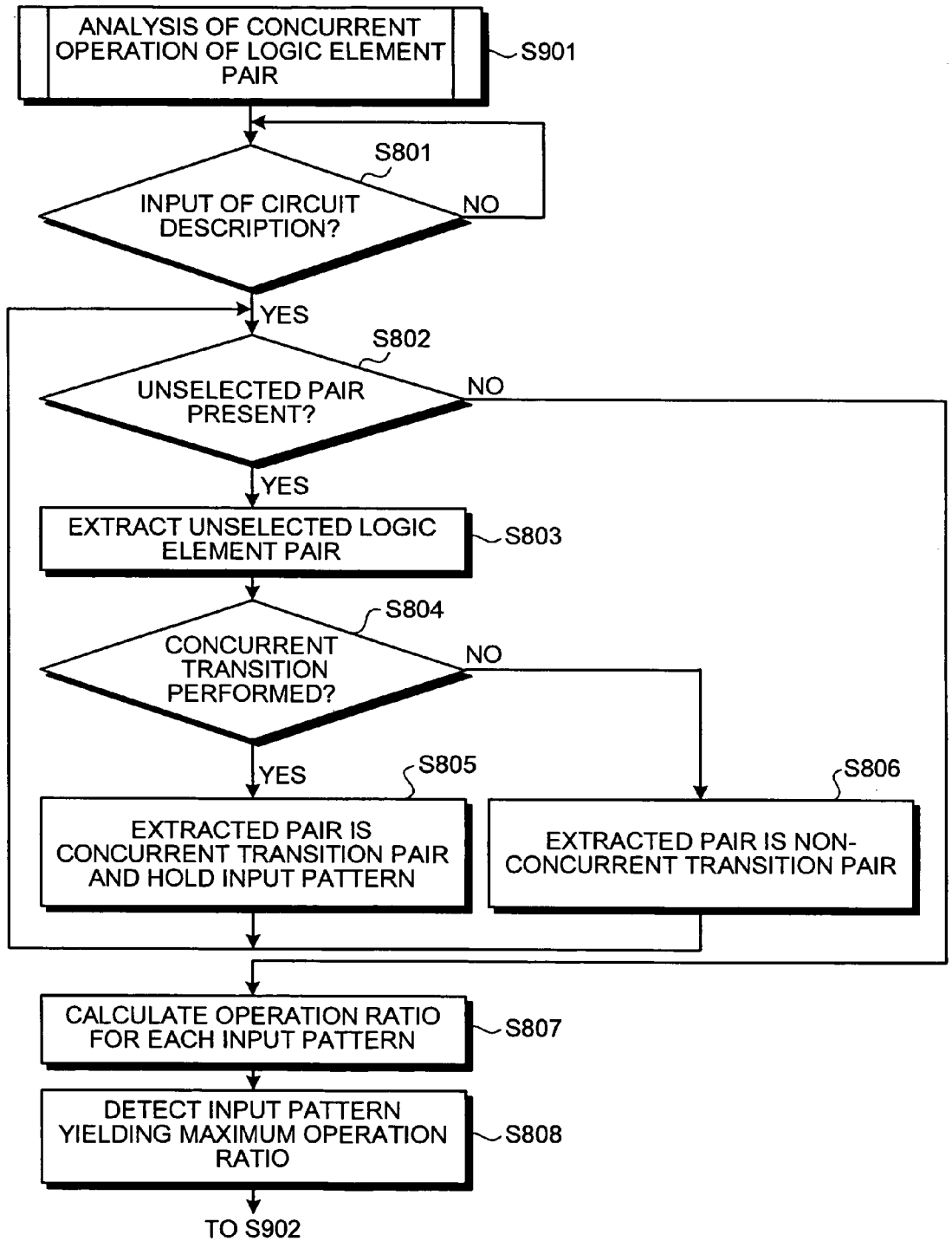
FIG. 10 is a flowchart of the analysis of concurrent operation of logic element pairs.

The process procedure for the analysis of concurrent operation of logic pairs (step S901) illustrated in FIG. 9 is described. FIG. 10 is a flowchart of the process procedure for the analysis of concurrent operation of logic element pairs (step S901). The same steps as in FIG. 8 are assigned the same step numbers, and are not explained further. In the process procedure illustrated in FIG. 10, steps S801 to S808 illustrated in FIG. 8 are executed. Following step S808, the process procedure proceeds to the analysis of the highest operation ratio of the entire circuit (step S902).

Figure 11:
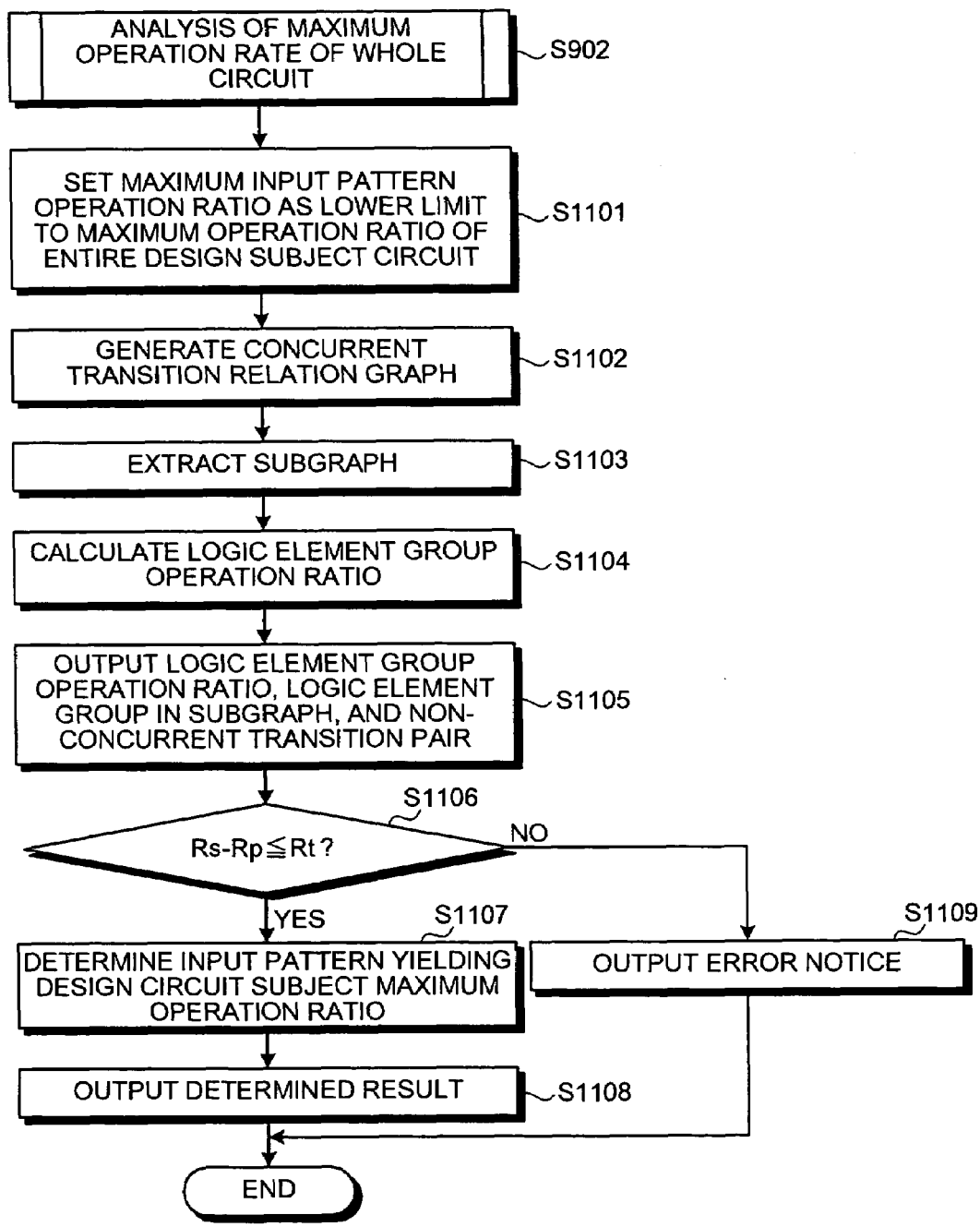
FIG. 11 is a flowchart of an analysis of the highest operation ratio of the entire circuit.

FIG. 11 is a flowchart of a process procedure for the analysis of the highest operation ratio of the entire circuit (step S902).

At the start of the procedure, a highest input pattern operation ratio Rp is set as the lower limit to the highest operation ratio of the entire circuit design subject 200 (step S1101). Subsequently, the graph generator 306 generates a concurrent transition relation graph using all found input patterns (step S1102). In the case of the graphic chart in FIG. 6, the input patterns P1, P2 are found, thus the graph generator 306 generates the concurrent transition relation graph Z illustrated in FIG. 7.

The subgraph extractor 307 then extracts a subgraph including the highest number of logic elements from the concurrent transition relation graph (step S1103). From the concurrent transition relation graph Z in FIG. 7, the most complete subgraph C is extracted.

The group ratio calculator 308 calculates a logic element group operation ratio Rs of a logic element group included in the subgraph extracted by the subgraph extractor 307 (step S1104). This logic element group operation ratio Rs becomes the upper limit to the highest operation ratio of the entire circuit design subject 200.

The output unit 310 puts out the logic element group operation ratio Rs, the logic element group in the extracted subgraph, and the non-concurrent transition pair obtained at step S806 (step S1105). The obtained logic element group operation ratio Rs provides a designer with the upper limit to the highest operation ratio of the entire circuit design subject 200, allowing the designer to use the logic element group operation ratio Rs as an index of the reliability of a highest input pattern operation ratio.

For example, if a difference between a logic element group operation ratio Rs and a highest input pattern operation ratio Rp is small, estimating the highest input pattern operation ratio Rp to be the highest operation ratio of the entire circuit design subject 200 poses no problem. The designer, therefore, can determine whether a quantity of decoupling capacitors is proper by using an input pattern yielding the highest input pattern operation ratio Rp (e.g., input pattern P1).

In addition, outputting a non-concurrent transition pair in advance prevents unnecessary insertion of a decoupling capacitor, thereby enabling a reduction in the chip area and manufacturing cost of the circuit design subject 200.

In the process procedure illustrated in FIG. 11, the determining unit 309 determines whether the condition $Rs-Rp \leqq Rt$ is satisfied (step S1106) following step S1105. Upon $Rs-Rp \leqq Rt$ being satisfied (YES at step S1106), the determining unit 309 determines the input pattern yielding the highest input pattern operation ratio Rp to be the input pattern that gives the entire circuit design subject 200 the highest operation ratio (step S1107).

The determined input pattern is then output as a determined result (step S1108). On the other hand, upon $Rs-Rp \leqq Rt$ not being satisfied (NO at step S1106), an error notice is output (step S1109), which brings a series of steps to an end.

A series of steps ranging from step S1106 to S1109 allow automatic execution of a reliable process to estimate the highest operation ratio of the entire circuit design subject 200, thereby reducing a design period and suppressing a difference between designers in inserting decoupling capacitors.

According to the above LSI analysis, the analysis of concurrent operation of logic element pairs and the analysis of the highest operation ratio of the entire circuit design subject 200 are separate from each other, thereby enabling a search for an input pattern space to be separate from a search for a group of logic elements operating concurrently on the circuit design subject 200 as each search is regarded as a different process. As a result, the LSI analysis is simplified, and is applicable to the circuit design subject 200 even if the circuit is a large-scale circuit.

As described above, the LSI analysis program, the recording medium storing the program, the LSI analysis apparatus, and the LSI analysis method according to the embodiment of the present invention improve the quality of an LSI and reduce the manufacturing cost of the LSI.

The LSI analysis method described in the present embodiment can be carried out by initiating a computer, such as personal computer or work station, to execute a prepared program. This program is recorded on a computer-readable recording medium of hard disk, flexible disk, CD-ROM, MO, DVD, etc., and is executed as the computer reads the program out of the recording medium. The program may be a transmittable medium that can be distributed via a network, such as the Internet.

The present invention achieves improved LSI qualities and lowered LSI manufacturing costs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein an large-scale integration (LSI) analysis program causing a computer to execute:
   receiving circuit description of a design subject circuit;
   extracting logic element pairs from among the circuit description;
   searching for an input pattern for each logic element pair, the input pattern causing the logic element pair to perform concurrent transition;
   calculating an operation ratio for each of the input patterns;
   detecting an input pattern yielding a highest operation ratio from among the calculated operation ratios; and
   outputting the detected input pattern.

2. The computer-readable recording medium according to claim 1, wherein
   the outputting includes outputting a logic element pair for which no input pattern is found.

3. An LSI analysis apparatus comprising:
   a receiving unit that receives circuit description of a design subject circuit;
   an extracting unit that extracts logic element pairs from among the circuit description;
   a searching unit that searches for an input pattern for each logic element pair, the input pattern causing the logic element pair to perform concurrent transition;
   a calculating unit that calculates an operation ratio for each of the input patterns;
   a detecting unit that detects an input pattern yielding a highest operation ratio from among the calculated operation ratios; and
   an output unit that outputs the detected input pattern.

4. The LSI analysis apparatus according to claim 3, wherein
   the output unit outputs a logic element pair for which no input pattern is found.

5. An LSI analysis method comprising:
   receiving circuit description of a design subject circuit;
   extracting arbitrary logic element pair from among the circuit description;
   searching for an input pattern for each logic element pair, the input pattern causing the logic element pair to perform concurrent transition;
   calculating an operation ratio for each of the input patterns;
   detecting an input pattern yielding a highest operation ratio from among the calculated operation ratios; and
   outputting the detected input pattern.

6. The LSI analysis method according to claim 5, wherein
   the outputting includes outputting a logic element pair for which no input pattern is found.

* * * * *